(12) United States Patent
Gallagher et al.

(10) Patent No.: US 9,321,634 B2
(45) Date of Patent: Apr. 26, 2016

(54) FORMING MAGNETIC MICROELECTROMECHANICAL INDUCTIVE COMPONENTS

(71) Applicant: INTERNATIONAL BUSINESS MACHINES CORPORATION, Armonk, NY (US)

(72) Inventors: William J. Gallagher, Ardsley, NY (US); Eugene J. O'Sullivan, Nyack, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/608,841

(22) Filed: Jan. 29, 2015

(65) Prior Publication Data

US 2015/0140687 A1    May 21, 2015

Related U.S. Application Data

(62) Division of application No. 13/796,496, filed on Mar. 12, 2013, now Pat. No. 9,105,841.

(51) Int. Cl.
*H01L 21/00* (2006.01)
*B81C 1/00* (2006.01)
*H01L 43/14* (2006.01)
*B81B 3/00* (2006.01)
*H01L 43/10* (2006.01)
(Continued)

(52) U.S. Cl.
CPC ............ *B81C 1/00373* (2013.01); *B81B 3/0021* (2013.01); *B81C 1/00142* (2013.01); *B81C 1/00706* (2013.01); *H01L 43/10* (2013.01); *H01L 43/12* (2013.01); *H01L 43/14* (2013.01); *B81B 2201/038* (2013.01); *B81B 2203/0118* (2013.01); *B81C 2201/0188* (2013.01); *H01F 41/046* (2013.01); *H01L 28/10* (2013.01)

(58) Field of Classification Search
CPC ..... H01L 43/12; H01L 43/10; H01L 23/5227; H01L 2924/30107; H01L 28/10; H01L 23/645; H01L 2924/01027; H01L 2924/19042; H01L 2924/01046; B81C 1/00373
USPC ........................ 438/3, 52; 257/531; 336/200
See application file for complete search history.

(56) References Cited

U.S. PATENT DOCUMENTS 5,327,033 A    7/1994   Guckel et al.
6,150,186 A    11/2000  Chen et al.
(Continued)

OTHER PUBLICATIONS

C. Ahn, et al., "Micromachined Planar Inductors on Silicon Wafers for MEMS Applications," IEEE Transactions on Industrial Electronics, vol. 45, No. 6, Dec. 1998, pp. 866-876.
(Continued)

*Primary Examiner* — Thien F Tran
(74) *Attorney, Agent, or Firm* — Cantor Colburn LLP; Vazken Alexanian

(57) ABSTRACT

A micro-electromechanical device and method of manufacture are disclosed. A sacrificial layer is formed on a silicon substrate. A metal layer is formed on a top surface of the sacrificial layer. Soft magnetic material is electrolessly deposited on the metal layer to manufacture the micro-electromechanical device. The sacrificial layer is removed to produce a metal beam separated from the silicon substrate by a space.

12 Claims, 8 Drawing Sheets

(51) Int. Cl.
*H01L 43/12* (2006.01)
*H01L 49/02* (2006.01)
*H01F 41/04* (2006.01)

(56) References Cited

U.S. PATENT DOCUMENTS

| | | |
|---|---|---|
| 6,653,170 B1 | 11/2003 | Lin |
| 7,285,492 B2 | 10/2007 | Wang et al. |
| 7,518,481 B2 | 4/2009 | Gardner et al. |
| 7,544,574 B2 | 6/2009 | Chiang et al. |
| 2006/0222871 A1 | 10/2006 | Bonhote et al. |
| 2009/0001969 A1 | 1/2009 | Berkcan |
| 2010/0244867 A1 | 9/2010 | Chong et al. |
| 2013/0122628 A1* | 5/2013 | Lee et al. ............... 438/52 |

OTHER PUBLICATIONS

D. Arnold, et al., "Electroplated Metal Microstructures Embedded in Fusion-Bonded Silicon: Conductors and Magnetic Materials," Journal of Microelectromechanical Systems, vol. 13, No. 5, Oct. 2004, pp. 791-798.

G. Zhang, et al., "A CMOS-MEMS Magnetic Thin-Film Inductor for Radio Frequency and Intermediate Frequency Filter Circuits," Circuits and Systems, 2004. ISCAS '04. Proceedings of the 2004 International Symposium on, May 23-26, 2004.

M. Allen, "MEMS Technology for the Fabrication of RF Magnetic Components," IEEE Trans, Mag., vol. 39, Sep. 2003, pp. 3073-3078.

S. Sadler, et al., "Micromachined Semi-Encapsulaed Spiral Inductors for Micro Electro Mechanical Systems (MEMS) Applications," IEEE Transactions of Magnetics, vol. 33, No. 5, Sep. 1997, pp. 3319-3321.

* cited by examiner

FORMING MAGNETIC MICROELECTROMECHANICAL INDUCTIVE COMPONENTS

CROSS-REFERENCE TO RELATED APPLICATIONS

The present disclosure is a divisional application of U.S. patent application Ser. No. 13/796,496, entitled "FORMING MAGNETIC MICROELECTROMECHANICAL INDUCTIVE COMPONENTS," filed on Mar. 12, 2013, which is incorporated herein by reference in its entirety.

BACKGROUND

The present invention relates to manufacturing of microelectromechanical devices (MEMS), and more specifically to methods for forming a component of MEMS inductors, transformers, inductive actuators and/or inductive sensors.

High performance soft magnetic materials can store magnetic energy, which can be used to build inductors or transformers for radio frequency circuits or power electronics. These soft magnetic materials can also concentrate, shape and guide magnetic flux, which can be used to form inductive MEMS structures. These inductive MEMS structures can therefore interact with a magnetic field, the mechanism of which can be used to build MEMS magnetic sensors and electromagnetic micro-actuators and/or generators.

MEMS inductors are usually composed of a conductive coil (e.g., copper lines) which carries currents and a magnetic core that stores magnetic energy. Material used in forming the magnetic core materials used in MEMS, usually Ni—Fe or Co—Fe based alloy, is generally deposited via electroplating or sputtering techniques. Electroplating requires external electrodes and a seed layer to carry current to produce the necessary electrochemical reactions. For wafer-level integration, these requirements are met by making electrical contacts at the edge of a silicon wafer having the MEMS inductor and a thick seed layer to ensure uniform current distribution across the entire wafer. This can be a challenge for large scale wafers and for three-dimensional MEMS structures. Additionally, most electroplating materials, such as Ni—Fe and Co—Fe, have a low resistivity (e.g., <45 micro-Ohm-centimeters). However, the low resistivity of these materials limits their application at high frequencies (e.g., >10 Megahertz). Sputtering, on the other hand, usually produces low deposition rates and generally does not provide conformal coverage. Additionally, magnetic films derived from sputtering are difficult to pattern subtractively due to the challenges of mask alignment and long etching times. Thick film sputtering processes require high vacuum and frequent system maintenance. thereby making sputtering processes expensive and impractical with respect to integration and manufacture of the magnetic cores, etc. The deposition process can result in high stress on a wafer, and, in particular, on large scale wafers (e.g., >200 mm).

SUMMARY

According to one embodiment of the present invention, a method of manufacturing a micro-electromechanical device includes: forming a metal layer of the micro-electromechanical device at a wafer; and electrolessly depositing a soft magnetic material on the metal layer to manufacture the micro-electromechanical device.

According to another embodiment of the present invention, a micro-electromechanical device includes: a wafer substrate; a metal layer coupled to at least one support structure to be suspended with respect to the wafer substrate; and a soft magnetic material electrolessly deposited on the metal layer.

According to another embodiment of the present invention, a method of manufacture an inductive component of a micro-electromechanical device includes: forming a wafer substrate having a support structure; forming a metal layer coupled to the support structure; and electrolessly depositing a soft magnetic material on the metal layer to manufacture the inductive component.

According to yet another embodiment of the present invention, a method of manufacture an a micro-electromechanical member includes: forming a sacrificial layer on a silicon substrate; forming a metal layer on a top surface of the sacrificial layer; electrolessly depositing a soft magnetic material on the metal layer; and removing the sacrificial layer to produce a metal beam separated from the silicon substrate by a space to manufacture the micro-electromechanical member.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 4-9 illustrate various stages of manufacture of the exemplary MEMS device shown in FIG. 2, in which:

FIG. 4 shows a first manufacturing stage in which a sacrificial layer is deposited on a wafer substrate;

FIG. 5 shows a second manufacturing stage in which a photoresist is deposited on the silicon substrate and/or the sacrificial layer;

FIG. 6 shows a third manufacturing stage in which metal layer is deposited on the sacrificial layer in the patterned area;

FIG. 7 shows a fourth manufacturing stage in which the photoresist and the sacrificial layer have been removed;

FIG. 8 shows a fifth manufacturing stage in which an active metal surface is applied to the exposed surfaces of the metal layer;

FIG. 9 shows a sixth manufacturing stage in which a soft magnetic metal coating is applied to the active metal surface using electroless deposition;

FIGS. 10-14 illustrate various stages of manufacture of a MEMS structure that is suspended over a substrate as shown in FIG. 3, in which:

FIG. 10 show a first manufacturing stage in which a metal layer is formed on a substrate;

FIG. 11 shows a second manufacturing stage in which the photoresist has been removed;

FIG. 12 shows a third manufacturing stage in which a portion of the silicon substrate is removed from underneath the metal layer;

FIG. 13 shows a fourth manufacturing stage in which an active metal surface may be formed on the exposed metal surfaces of the metal beam;

FIG. 14 shows a fifth manufacturing stage in which a soft magnetic metal layer is applied to the metal layer using electroless deposition;

FIGS. 17-22 illustrate various stages of manufacture of the exemplary MEMS actuator shown in FIG. 16, in which:

FIG. 17 shows a first manufacturing stage in which a sacrificial layer is deposited on a silicon substrate;

FIG. 18 shows a second manufacturing stage in which a photoresist is deposited on the silicon wafer and/or the sacrificial layer;

FIG. 19 shows a third manufacturing stage in which metal layer is deposited in the patterned area onto the sacrificial layer;

FIG. 20 shows a fourth manufacturing stage in which an active metal surface is prepared for electroless deposition;

FIG. 21 shows a fifth manufacturing stage in which a soft magnetic metal coating is applied to the top and side surfaces of the metal layer via the active metal surface;

FIG. 22 shows a sixth manufacturing stage in which the sacrificial layer is removed to reveal the bottom surface of the metal layer separated from the silicon substrate by a space to thereby form the MEMS actuator.

DETAILED DESCRIPTION

Figure 1:
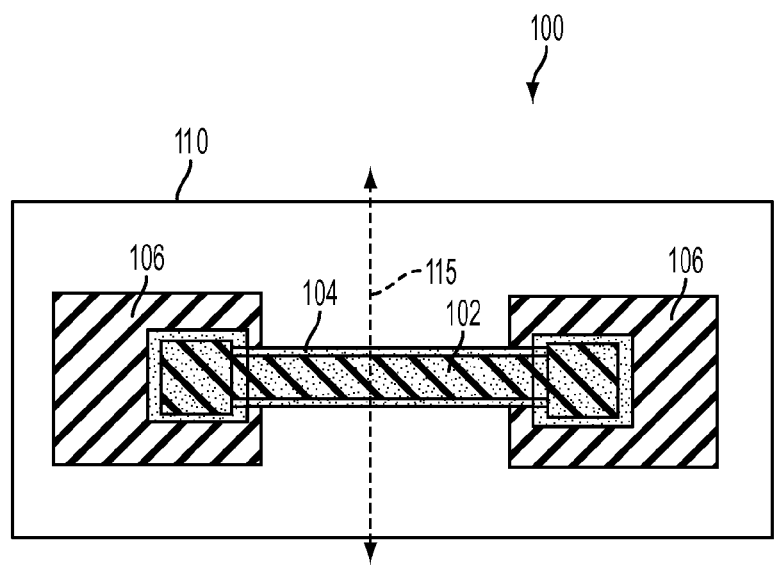
FIG. 1 shows a top view of an exemplary micro-electromechanical (MEMS) inductor that may be formed using the exemplary methods disclosed herein.

FIG. 1 shows a top view of an exemplary micro-electromechanical (MEMS) inductor 100 that may be formed using the exemplary methods disclosed herein. The exemplary MEMS device 100 includes a wafer substrate 110 which may have support structures 106 formed thereon. A metal beam 102 (also referred to herein as a "metal layer") is formed on the wafer so as to be supported by support structures 106 at least one end of the metal beam 102. As shown in FIG. 1, the metal beam 102 is supported at both ends, employing both support structures 106. However, in alternate embodiments, the metal beam 102 may be supported by only one of the support structures 106 to form a cantilevered metal beam. The metal beam 102 may be any suitably electrically conductive material that is used in an inductive MEMS device, such as copper, nickel, cobalt, etc. The metal beam 102 may be coated by a layer 104 of soft magnetic material to form an inductive component from the metal beam 102. The soft magnetic material layer 104 may be applied to the metal beam 102 using the various methods disclosed herein. In various embodiments, a soft magnetic material may be a material having a coercivity less than about 100 Oersteds and is generally a material having a coercivity less than about 5 Oersteds.

Figure 2:
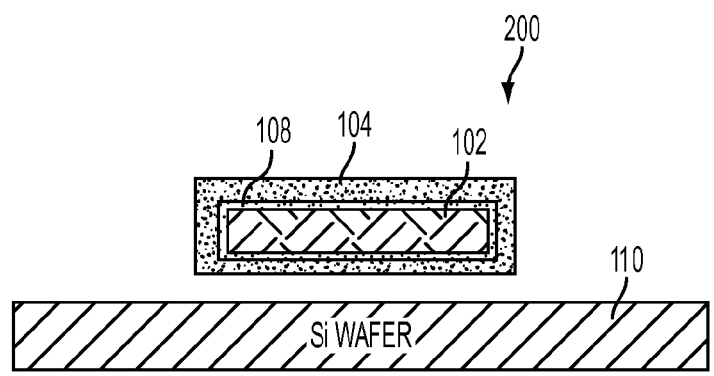
FIG. 2 shows a cross-section of the exemplary MEMS device shown in FIG. 1.

FIG. 2 shows a cross-section 200 of the exemplary MEMS device 100 along the cross-section line 115 shown in FIG. 1. The exemplary cross-section 200 shows the metal beam 102 supported above wafer substrate 110 with a space between the metal beam 102 and the wafer substrate 110. The outer surfaces of the metal beam 102 are coated by an active metal layer 108. The active metal layer 108 is coated with a soft magnetic material 104. The soft magnetic material 104 may be deposited on the active metal layer 108 by electroless deposition. Electroless deposition is the process of depositing a coating with the aid of a chemical reducing agent in solution, and without the application of external electrical power. Electroless deposition generally occurs at an active surface of a metal. Thus, electroless deposition may be performed on the wafer 100 as a unit, wherein the soft magnetic material will coat only at the metal layer 102 and not on the silicon substrate 110. Due to the selective deposition that occurs during electroless deposition, the core (i.e., the soft magnetic material layer 104) may be deposited over an entire surface of the metal beam 102 using a single processing step. The metal beam 102 may therefore be covered by a seamless layer of deposited soft magnetic material layer 104. A seamless soft magnetic material layer 104 enables a closed magnetic loop, thereby enhancing inductance with respect to a layer that includes seams, as results from prior deposition techniques.

In an exemplary embodiment, the active metal layer 108 may include a layer of palladium in an exemplary embodiment. The layer of palladium may be a few atomic layers in thickness. The layer of palladium is deposited on the metal beam 102 to increase the reactivity of the metal beam 102 to the electroless deposition process. The layer of palladium is generally deposited on the metal beam 102 when the metal of the metal beam 102 is made of a metal, such as copper, that is non-reactive to electroless deposition. When the metal beam 102 made of a metal, such as nickel, cobalt, etc., that is reactive to electroless deposition, the soft magnetic material layer 104 may be coated directly on the metal beam 102 without the use of an active metal layer 108. A manufacturing process for obtaining the metal beam as shown in FIG. 2 is discussed below with respect to FIGS. 4-9.

Figure 3:
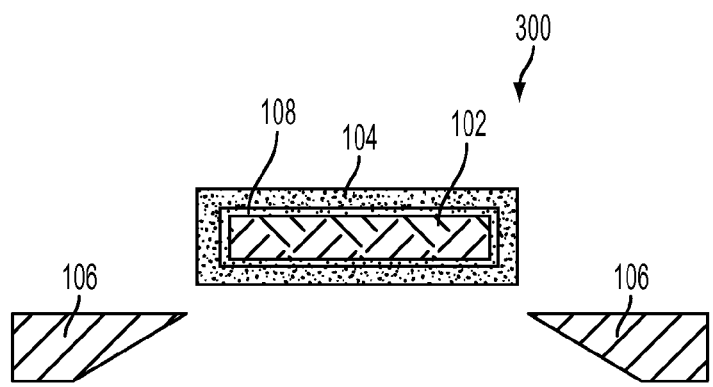
FIG. 3 shows an alternate cross-section exemplary MEMS device shown in FIG. 1.

FIG. 3 shows an alternate cross-section 300 of the metal beam 102 indicated by the cross-section line 150 shown in FIG. 1. In the alternate cross-section 300, a section of the silicon substrate 106 has been removed, generally by a chemical etching process, or deep reactive ion etching (DRIE), to achieve the suspended metal beam 102. Metal beam 102 may be supported by a support structure formed on the wafer substrate 110 or by the silicon substrate 110 itself. The metal beam 102 has an active metal layer 108 and a soft magnetic material 104 coating the metal beam 102. As discussed above with respect to FIG. 2, the active metal layer 108 is applied to provide a surface of the metal beam 102 that is reactive to electroless deposition. Electroless deposition can be performed either at the active metal layer 108 or directly to the metal beam 102, depending on the chemical composition of the metal beam 102. A manufacturing process for obtaining the exemplary metal beam 102 shown in FIG. 3 is discussed below with respect to FIGS. 10-14.

Figure 4:

FIGS. 4-9 illustrate various stages of manufacture of the exemplary MEMS device shown in FIG. 2. The MEMS device may include an inductor, and actuator, a generator or other suitable MEMS structure or member. FIG. 4 shows a first manufacturing stage in which a sacrificial layer 402 is deposited on a wafer substrate 400. The wafer substrate 400 may include a silicon substrate in various embodiments. The sacrificial layer 402 may include a metallic material, an oxide material or a photoresist material and may have a thickness in a range from about 1 micron to about 100 microns.

Figure 5:
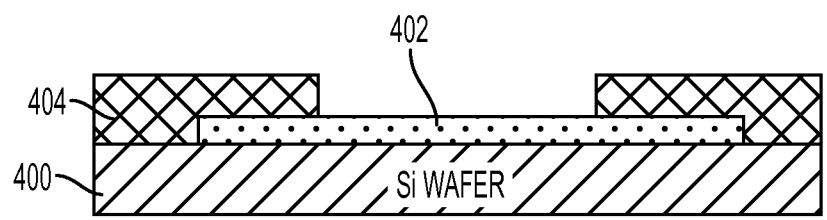
Figure 6:
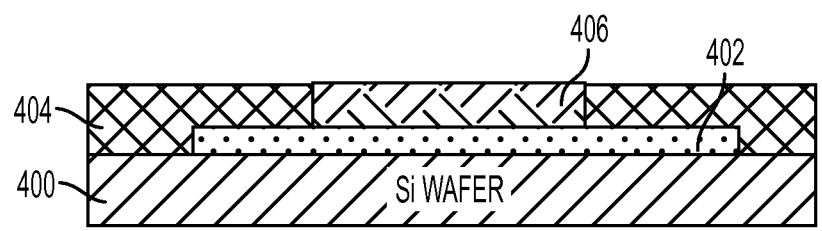

FIG. 5 shows a second manufacturing stage in which a photoresist 404 is deposited on the silicon substrate 400 and/or the sacrificial layer 402. Once, the photoresist 404 is deposited, a pattern may be formed in the photoresist 404 using standard lithography methods to expose a portion of the sacrificial layer 402 for metal deposition. FIG. 6 shows a third manufacturing stage in which metal layer 406 is deposited on the sacrificial layer 402 in the patterned area. The deposited metal layer 406 may be supported at one or more ends by the support structures 106 shown in FIG. 1. In an exemplary embodiment, the metal layer 406 may include copper. However, any suitable metal, such as nickel, cobalt, etc., may be used to form the metal layer 406 in alternate embodiments. The metal layer 406 may be deposited using electroplating, sputtering or other known deposition methods.

Figure 7:
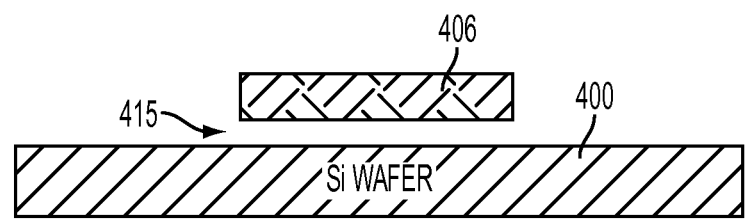

FIG. 7 shows a fourth manufacturing stage in which the photoresist 404 and the sacrificial layer 402 have been removed. In one embodiment, the sacrificial layer 402 may be removed by an etching process. Once the sacrificial layer 402 is removed, the portion of the metal layer 406 shown in FIG. 7 is supported above the silicon substrate 400 so that a space 415 resides between the silicon substrate 400 and the metal layer 406.

Figure 8:
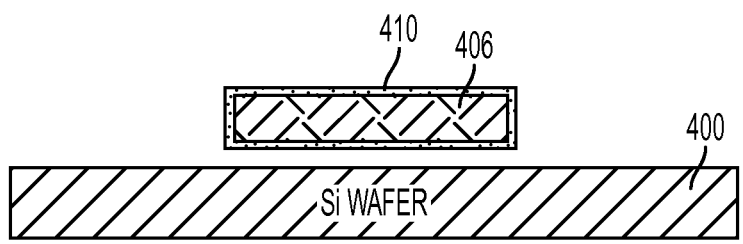

FIG. 8 shows a fifth manufacturing stage in which an active metal surface 410 is applied to the exposed surfaces of the metal layer 406. In an exemplary embodiment, the metal layer 406 includes a copper material and the active metal surface 410 includes a layer of palladium. In order to apply the active metal surface 410 to the metal layer 406, the wafer may be submerged in a solution of the active metal, generally for a submersion time from about 30 seconds to about 60 seconds.

Figure 9:
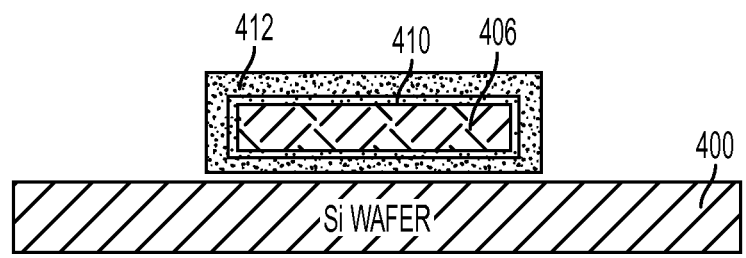

FIG. 9 shows a sixth manufacturing stage in which a soft magnetic metal coating 412 is applied to the active metal surface 410 using electroless deposition. In various embodiments, the soft magnetic alloy material may be a high-resistivity metal, such as a metal where eddy current begins to dominate at frequencies above about 1 Megahertz. Exemplary high-resistivity metals may include a cobalt alloy, such as cobalt-tungsten-phosphorus (Co—W—P) or a Co—W—P alloy. As discussed above, for various metals of the metal layer 406, the fifth manufacturing stage may be left out and the soft magnetic material 412 may be coated directly to the metal layer 406.

In prior methods, without the use of electroless deposition, the soft magnetic material is formed on the bottom surface of metal beam by depositing a (bottom) layer of the soft magnetic material and then depositing a metal layer of the metal beam on top of the bottom layer. Additionally, side-wall layers may be formed on the metal beam using separate electroplating and/or sputtering deposition steps. These prior methods require a number of additional steps to create the metal beam and/or inductor component. Electroless deposition therefore accomplishes depositing the soft magnetic material on the bottom surface without these additional steps.

Figure 10:
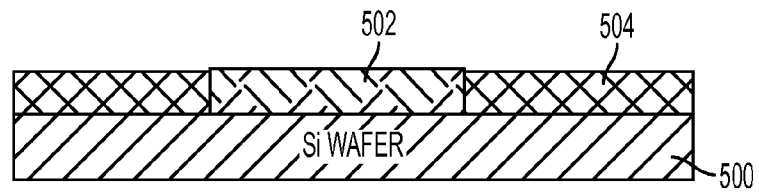
Figure 11:
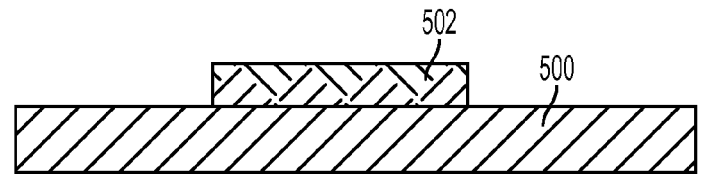
Figure 12:
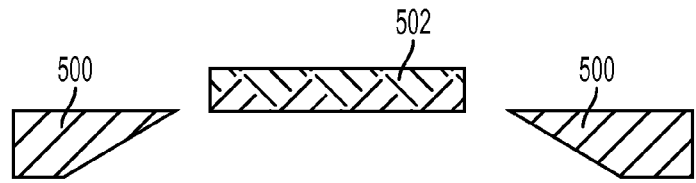

FIGS. 10-14 illustrate various stages of manufacture of a MEMS structure that is suspended over a substrate as shown in FIG. 3. The MEMS structure may include an inductor, an actuator, a generator or other suitable MEMS member. FIG. 10 show a first manufacturing stage in which a metal layer 502 is formed on a substrate 500. A mask material 504, such as a photoresist layer is formed on the silicon substrate 500 and patterned using standard photolithography methods to expose a surface of the silicon substrate 500. Metal layer 502 may then be deposited on the exposed surface of the silicon substrate 500 using a standard deposition method. FIG. 11 shows a second manufacturing stage in which the photoresist 504 has been removed. The metal layer 502 is then left resting upon the silicon substrate 500. FIG. 12 shows a third manufacturing stage in which a portion of the silicon substrate 500 is removed from underneath the metal layer 502. The silicon substrate 500 may be removed by patterning and etching the silicon substrate 500. At the end of the third manufacturing stage, a metal beam 502 is suspended with little or no silicon substrate 500 underneath its suspended portion. At least one end of the metal beam 502 may be attached to a support structure formed at the silicon substrate 500 or to the silicon substrate 500 itself.

Figure 13:
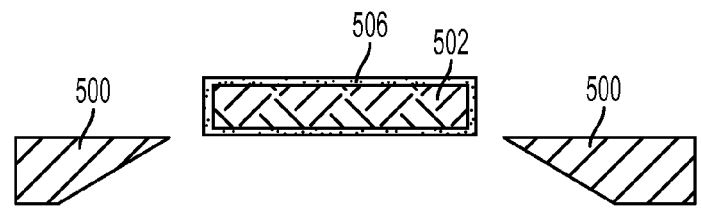
Figure 14:
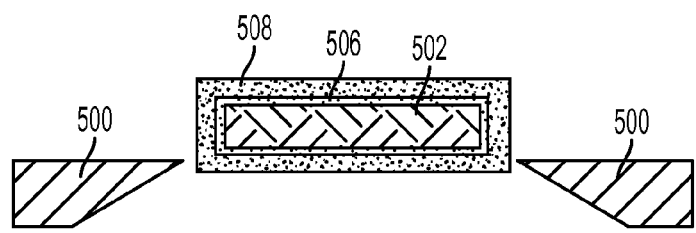

FIG. 13 shows a fourth manufacturing stage in which an active metal surface 506, such as a layer of palladium, may be formed on the exposed metal surfaces of the metal beam 502. The fourth manufacturing stage may be implemented for metal beams 502 that include a metal that is non-reactive to electroless deposition, such as copper. The layer of palladium coats the non-reactive metal and provides a surface reactive to electroless deposition. For metal beams 502 made of reactive metals, such as nickel, cobalt, etc., the fourth manufacturing stage may be left out. FIG. 14 shows a fifth manufacturing stage in which a soft magnetic metal layer 508 is applied to the metal layer 502 using electroless deposition. In various embodiments, the soft magnetic coating 508 may be a high-resistivity metal, a cobalt alloy, such as Co—W—P or a Co—W—P alloy. The soft magnetic coating 508 may be applied either to the active metal layer 506 or directly to the metal beam 502, depending on whether an active metal layer 406 is used.

Figure 15:
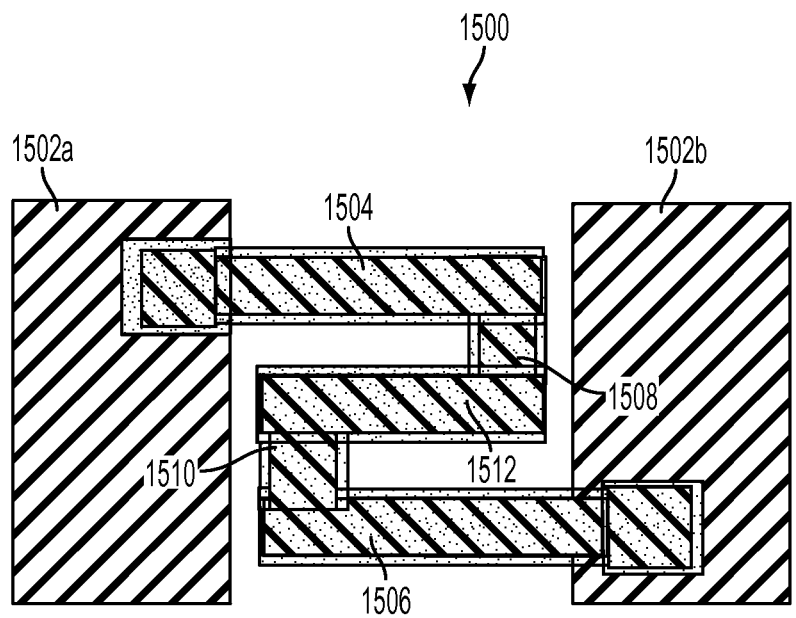
FIG. 15 shows an alternate embodiment of a suspended metal layer of an inductive MEMS component.

FIG. 15 shows an alternate embodiment of a suspended metal layer of an inductive MEMS component. The alternate embodiment shows a structure 1500 forming an "S" shape between support structures 1502a and 1502b. The structure 1500 includes two cantilevered metal beams 1504 and 1506 coupled to support structures 1502a and 1502b, respectively. Vias 1508 and 1510 are coupled to the extended ends of the metal beams 1504 and 1506, respectively. The vias 1508 and 1510 support a metal beam 1512 therebetween to complete the "S" shape. Soft magnetic material may be electrolessly deposited at the metal beam 1512 in the same step as electroless deposition at metal beams 1504 and 1506. Additional beam structures may have a meandering shape, a solenoidal shape a toroidal shape, etc.

Figure 16:
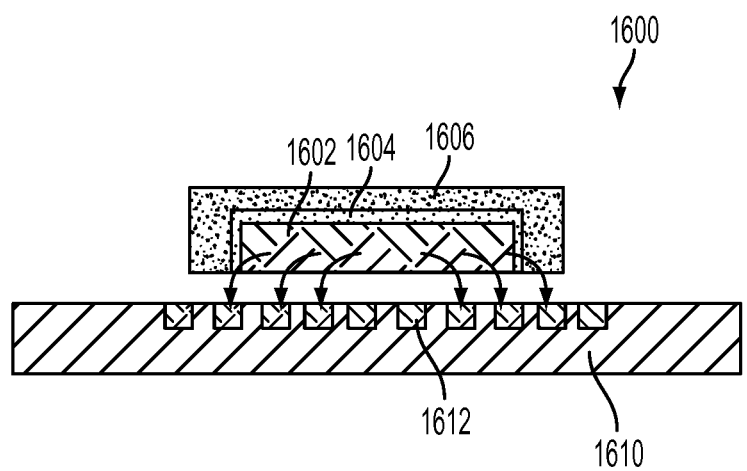
FIG. 16 shows an exemplary MEMS actuator that may be formed using the exemplary manufacturing process disclosed herein.

FIG. 16 shows an exemplary MEMS actuator 1600 that may be formed using the exemplary manufacturing process disclosed herein. The exemplary MEMS actuator 1600 includes a metal beam 1602 that is suspended above a silicon substrate 1610. The suspended metal beam is 1602 coated on side surfaces and top surfaces by a soft magnetic material layer 160 using electroless deposition. Depending on the metal of the metal beam 1602, an active metal layer 1606 may be disposed along the top and side surfaces between the metal beam 1602 and the soft magnetic material layer 1606. The substrate 1610 may have an inductive coil 1612 formed therein below the metal beam 1602. An electric current passed through the inductive coil 1612 may be used to actuate the suspended metal beam 1602. Alternatively, motion of the metal beam 1602 relative to the inductive coil 1612 may be used to induce a current in the inductive coil 1612 that may be detected.

Figure 17:
Figure 18:
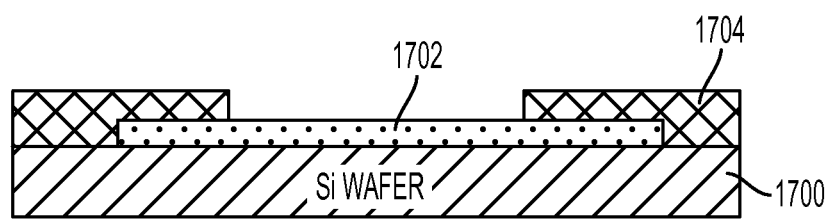
Figure 19:
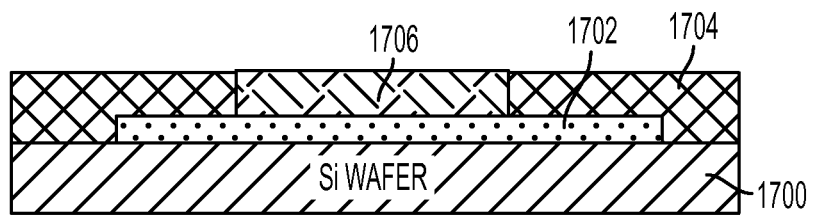

FIGS. 17-22 illustrate various stages of manufacture of the exemplary MEMS actuator 1600 shown in FIG. 16. Although the manufacturing stages shown in FIGS. 17-22 are discussed with respect to manufacturing a MEMS actuator, these stages may be applied towards manufacturing a MEMS inductor, a MEMS generator or other suitable MEMS structure or member. FIG. 17 shows a first manufacturing stage in which a sacrificial layer 1702 is deposited on a silicon substrate 1700. In various embodiments, the sacrificial layer 1702 may include a metallic material or a photoresist material and may have a thickness in a range from about 1 micron to about 100 microns. FIG. 18 shows a second manufacturing stage in which a photoresist 1704 is deposited on the silicon wafer 1700 and/or the sacrificial layer 702. A pattern may be formed at the metal layer 1702 in the photoresist 1704 using standard lithography methods. FIG. 19 shows a third manufacturing stage in which metal layer 1706 is deposited in the patterned area onto the sacrificial layer 1702. The deposited metal layer 1706 may be supported at one or more ends by a support structure (not shown). In an exemplary embodiment, the metal layer 1706 may include copper. However, any suitable metal, such as nickel, cobalt, etc. may be used to form the metal layer 1706. The metal layer 1706 may be deposited using electroplating, sputtering or other known deposition methods.

Figure 20:
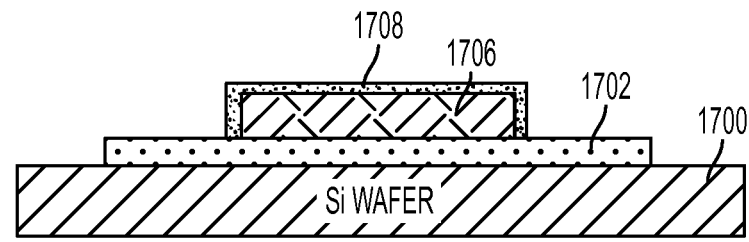
Figure 21:
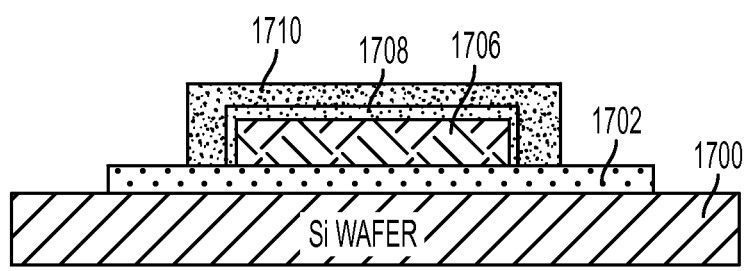
Figure 22:
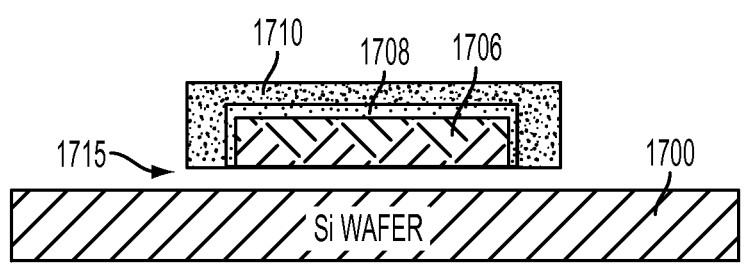

FIG. 20 shows a fourth manufacturing stage in which an active metal surface 1708 is prepared for electroless deposition. A top surface and side surfaces of the metal layer 1706 are exposed upon removing the photoresist layer 1704. A bottom surface of the metal layer 1706 is unexposed due to its contact with the sacrificial layer 1702. The wafer may be submerged in a solution of the active metal for a suitable submersion time to form the active metal surface 1708 on top and side surfaces. FIG. 21 shows a fifth manufacturing stage in which a soft magnetic metal coating 1710 is applied to the top and side surfaces of the metal layer 1706 via the active metal surface 1708. For metal layers 1706 made of metal that are reactive to electroless deposition, the soft magnetic material may be deposited directly on the metal layer 1706. The soft magnetic material may be a high-resistivity metal, a cobalt alloy, such as Co—W—P or an alloy of Co—W—P, in various embodiments. FIG. 22 shows a sixth manufacturing stage in which the sacrificial layer 1702 is removed to reveal the bottom surface of the metal layer 1706 separated from the silicon substrate by a space 1715 to thereby form the MEMS actuator.

Figure 23:
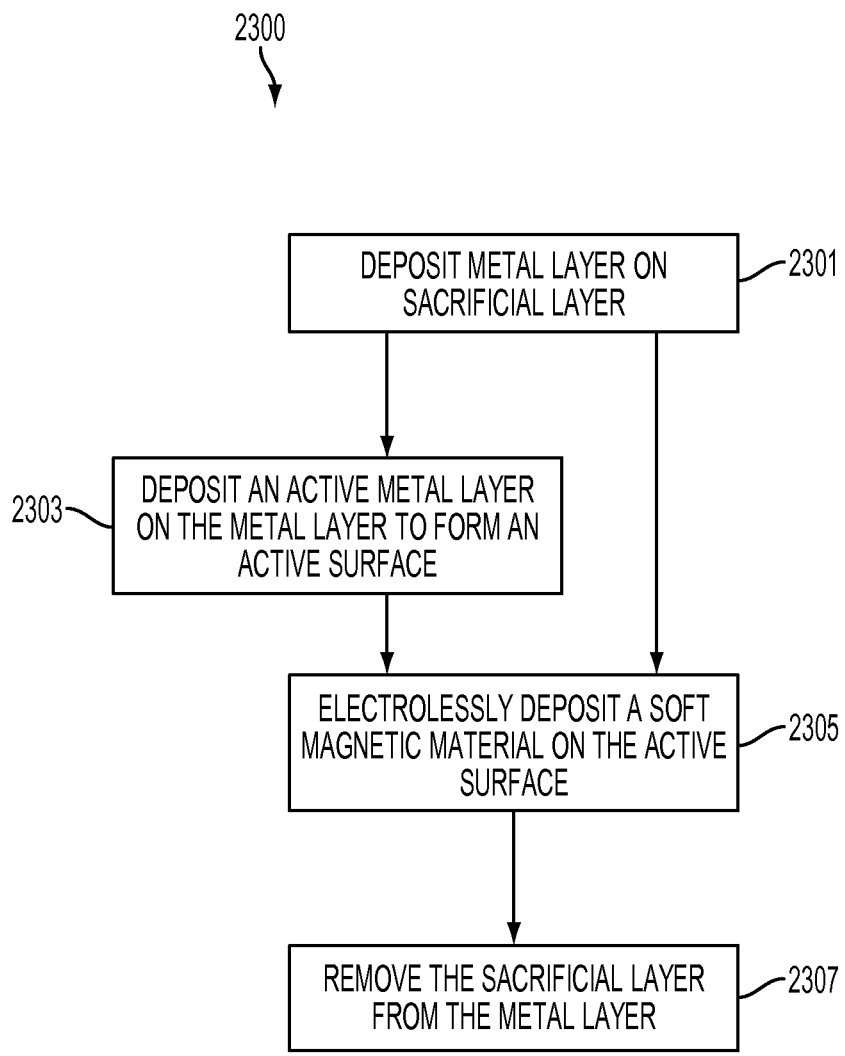
FIG. 23 shows a flowchart illustrate an exemplary manufacturing process for producing the MEMS actuator.

FIG. 23 shows a flowchart 2300 illustrating an exemplary manufacturing process for producing the MEMS actuator. In block 2301, a metal layer is deposited on top of a sacrificial layer. After block 2301, the manufacturing process may proceed to block 2303 to deposit an active metal layer such as a layer of palladium on the metal layer. Then in Block 2305, a soft magnetic material may be deposited on the active metal layer. Alternately, the process may proceed from block 2301 directly to block 2305, depending on the composition of the metal layer. In block 2307, the sacrificial layer may be removed to produce the MEMS actuator. It is noted that the action of block 2307 (removing the sacrificial layer) may be performed directly after block 2301 to produce either of the MEMS devices of FIGS. 2 and 3.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for exemplary embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of manufacturing a micro-electromechanical device, comprising:
   forming a sacrificial layer on a wafer;
   forming a metal layer of the micro-electromechanical device on the sacrificial layer;
   electrolessly depositing a soft magnetic material on the metal layer to coat a top surface and side surfaces of the metal layer; and
   removing the sacrificial layer after electrolessly depositing the soft magnetic material to produce a suspended metal beam coupled to at least one support structure of the wafer, wherein removing the sacrificial layer reveals a bottom surface of the metal layer.

2. The method of claim 1 further comprising forming an active metal surface on the metal layer and electrolessly depositing the soft magnetic material on the active metal surface.

3. The method of claim 2, wherein the forming the active metal surface further comprises forming a layer of palladium on a surface of the metal layer.

4. The method of claim 1, wherein the soft magnetic material is one of: a high-resistivity material, a cobalt-based alloy, and cobalt-tungsten-phosphorus-based alloy.

5. A method of manufacture an inductive component of a micro-electromechanical device, comprising:
   forming a wafer substrate having a support structure;
   forming a sacrificial layer on the wafer substrate;
   forming a metal layer coupled to the support structure on the sacrificial layer; and
   electrolessly depositing a soft magnetic material on a top surface and side surfaces of the metal layer; and
   removing the sacrificial layer after electrolessly depositing the soft magnetic material to manufacture the inductive component having a bottom surface that reveals the metal layer.

6. The method of claim 5 further comprising forming an active metal surface on the metal layer and electrolessly depositing the soft magnetic material on the active metal surface.

7. The method of claim 6, wherein the forming the active metal surface further comprises forming a layer of palladium on a surface of the metal layer.

8. The method of claim 5, further comprising forming a first part of the metal layer coupled to the support structure and second part of the metal layer on a sacrificial layer; and removing the sacrificial layer to form a supported metal beam from the metal layer.

9. The method of claim 5 further comprising forming the metal beam to be supported over an electrically conductive element in the wafer.

10. A method of manufacturing a micro-electromechanical member, comprising:
   forming a sacrificial layer on a silicon substrate;
   forming a metal layer on a top surface of the sacrificial layer;
   electrolessly depositing a soft magnetic material on the metal layer to coat a top surface and side surfaces of the metal layer; and
   removing the sacrificial layer after electrolessly depositing the soft magnetic material to produce a metal beam separated from the silicon substrate by a space, wherein removing the sacrifiacial layer reveals a bottom surface of the metal layer.

11. The method of claim 10 further comprising forming an active metal surface on the metal layer and electrolessly depositing the soft magnetic material on the active metal surface.

12. The method of claim 10, wherein the soft magnetic material is one of: a high-resistivity material, a cobalt-based alloy, and cobalt-tungsten-phosphorus.

\* \* \* \* \*